US006971917B2

(12) United States Patent
Faust et al.

(10) Patent No.: US 6,971,917 B2
(45) Date of Patent: Dec. 6, 2005

(54) SOCKET FOR AN ELECTRICALLY OPERATED DEVICE

(75) Inventors: Winfried Faust, Lüdenscheid (DE); Hans-Peter Mews, Lüdenscheid (DE)

(73) Assignee: Vossloh-Schwabe Deutschland GmbH, Ludenscheid (DE)

( * ) Notice: Subject to any disclaimer, the term of this patent is extended or adjusted under 35 U.S.C. 154(b) by 0 days.

(21) Appl. No.: 10/776,350

(22) Filed: Feb. 12, 2004

(65) Prior Publication Data

US 2004/0219839 A1 Nov. 4, 2004

(30) Foreign Application Priority Data

Feb. 12, 2003 (DE) ................................ 103 05 647

(51) Int. Cl.[7] .................................................. H01J 1/00
(52) U.S. Cl. .................................... 439/619; 439/699.2
(58) Field of Search ................................ 439/358, 356, 439/669.2, 619, 617, 621; 313/318.01, 318.02; 362/659, 368, 287, 147

(56) References Cited

U.S. PATENT DOCUMENTS 5,035,643 A * 7/1991 Forish et al. ............... 439/358
5,296,780 A * 3/1994 Haraden et al. ....... 313/318.09
5,492,477 A * 2/1996 Moon .......................... 439/57
5,695,367 A 12/1997 Takano et al.
5,709,450 A * 1/1998 Francis et al. .............. 362/546
5,989,067 A * 11/1999 Morgan et al. ............. 439/617
6,254,252 B1 * 7/2001 Coushaine et al. ......... 362/226
6,692,308 B2 * 2/2004 Henrici et al. ........... 439/699.2

FOREIGN PATENT DOCUMENTS

| | | |
|---|---|---|
| DE | 100 11 250 A1 | 9/2001 |
| DE | 201 20 673 U1 | 5/2002 |
| JP | 08-106966 A | 4/1996 |

* cited by examiner

*Primary Examiner*—Alexander Gilman
(74) *Attorney, Agent, or Firm*—Foley & Lardner LLP

(57) ABSTRACT

A socket according to the invention for an electrically operated device has two housing parts (9, 11), which are held together by clamping springs (22, 23). Each clamping spring may have, for example, at least one for example rectangular leg (28) with a recess, which in the installed state is interlocked with a snap-in lug of one housing part (11). Another leg (29) of each clamping spring (22, 23) extends at an angle <90° to the leg (28) and rests resiliently on the other housing part (9). As a result, production variations that occur can be compensated for, so that both housing parts (9, 11) are held against one another without play. The production and assembly of such lamp sockets are simplified considerably, compared to known lamp sockets.

18 Claims, 3 Drawing Sheets

SOCKET FOR AN ELECTRICALLY OPERATED DEVICE

CROSS-REFERENCE TO RELATED PATENT APPLICATIONS

Federal Republic of Germany Priority Application 103 05 647.5, filed Feb. 12, 2003, including the specification, drawings, claims and abstract, is incorporated herein by reference in its entirety.

BACKGROUND OF THE INVENTION

The invention relates to a socket for an electrically operated device, such as a lamp, in particular, a gas discharge lamp or a fluorescent lamp.

Lamp sockets or similar sockets for other kinds of electrically operated devices as a rule have a plastic housing that comprises a plurality of parts, for instance, two parts. These parts must be joined together in the production of the socket. The housing parts as a rule enclose an interior, in which one or more contact means are accommodated. The housing parts must be held against one another in such a way that neither during shipping and handling nor in later use can they be detached from one another unintentionally.

Moreover, some sockets require clamping or retaining means for mechanically securing the electrically operated devices that are mechanically held by the socket and are electrically connected. Such clamping or retaining means in fluorescent lamp sockets or sockets for halogen lamps, for instance, are formed by clamping springs, which have a snap-in portion for the lighting means. It is known for the clamping spring to be secured with a rivet which at the same time is capable of holding socket parts together.

This kind of production and assembly of sockets proves to be complicated in terms of assembly technology. On the other hand, it is not readily possible to dispense with the assurance of a good connection between the two housing parts. It would therefore be desirable to provide a socket for an electrically operated device that is easy to produce and assemble.

SUMMARY OF INVENTION

According to one aspect of the invention, there has been provided a socket for an electrically operated device, comprising:

- a housing, including at least a first housing part and a second housing part, which together enclose an interior;
- at least one contact disposed in said interior; and
- at least one clamping spring having a first portion for snap-in fastening of the electrically operated device and a second portion that clamps and retains together the first and second housing parts.

Further objects, features and advantages of the present invention will become apparent from the detailed description of preferred embodiments that follows, when considered together with the accompanying figures of drawing.

BRIEF DESCRIPTION OF THE DRAWINGS

One exemplary embodiment of the invention is shown in the drawings, in which.

DETAILED DESCRIPTION OF THE PREFERRED EMBODIMENTS

Figure 1:
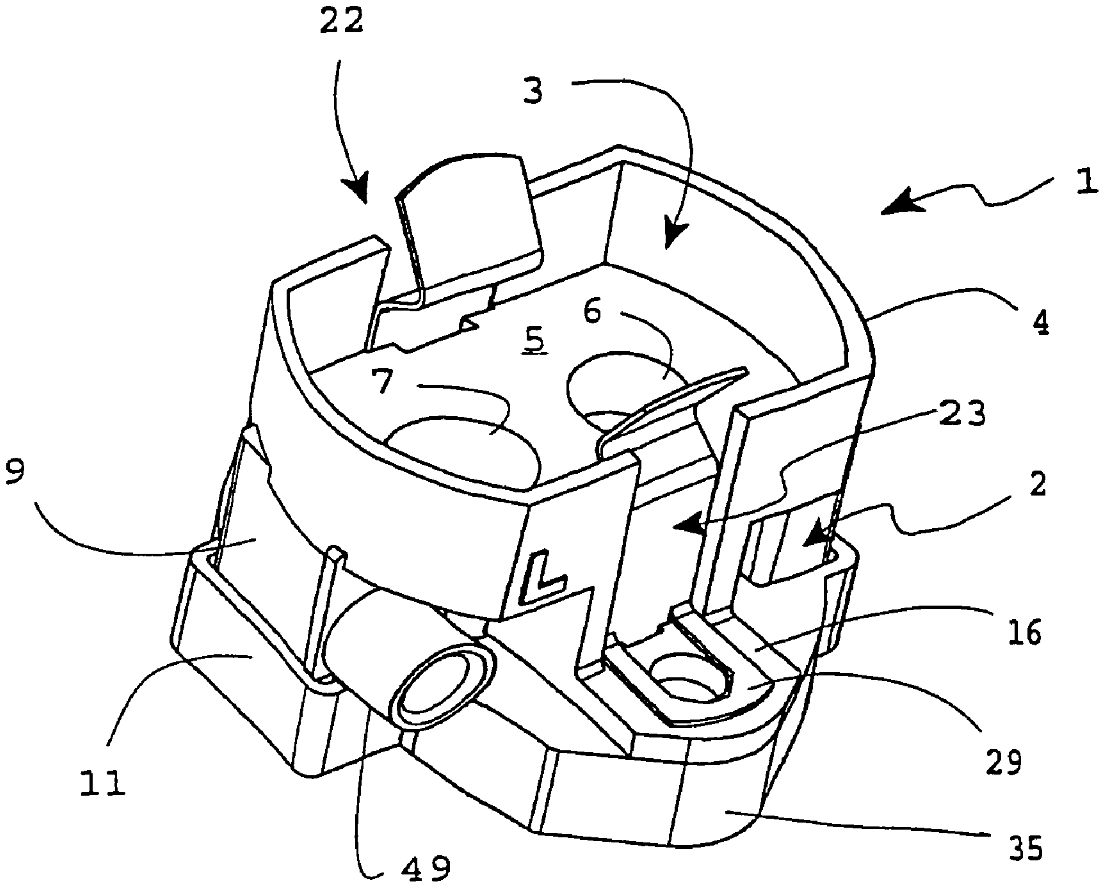
FIG. 1 is a perspective view of a socket of the invention.

The invention relates to a socket for an electrically operated device, such as a lamp, which includes a socket housing. The socket housing includes first and second housing parts, which together enclose an interior. At least one contact is disposed in the interior. A clamping spring clamps and retains together the first and second housing parts. It also acts a snap-in fastener for the electrically operated device.

According to one feature of the invention, the clamping spring secures an electrically operated device to the socket. The clamping spring simultaneously, acts to hold the two housing parts together. For that purpose, it is subdivided into a plurality of portions. The first portion serves to secure the electrically operated device, while the second portion forms the connecting means for the two housing parts. Thus, the connection between the housing parts is established in one operation in the assembly of the clamping spring. Rivets or other additional connecting means can be dispensed with.

According to another feature of the invention, no snap-in means or other connecting means between the housing parts are required. The housing parts can therefore be made from a relatively inelastic plastic or even a ceramic material. Highly heat-resistant plastics, which are only slightly elastic, or ceramic materials can be employed at least on the side of the lamp or even entirely for both housing parts. This opens up possibilities of miniaturization, which as a rule is associated with an increased heat load on the sockets.

The clamping spring preferably is made from metal, for instance, a sufficiently resilient steel, and can thus serve as a snap-in means, both for snap-in fastening or securing of the electrically operated device and for snap-in fastening of the two housing parts to one another. Alternatively, (for instance in a somewhat less easily assembled version), the clamping spring can also have a portion, which, after the joining together of the housing parts, is plastically deformed, in order to establish and assure the connection between the housing parts. The embodiment of the connection as a snap-in connection is preferred, because it can be installed with a simple plug-in motion, for instance.

According to another aspect of the invention the socket may have two or more housing parts. Preferably, it has a base part with a base plate portion, which is disposed on the side of the socket remote from the electrically operated device. The base plate portion preferably has at least two fastening portions for fastening the socket to a support, such as a lamp plate.

The housing part preferably is oriented toward the electrically operated device. Together with the base part, the housing part defines a parting seam, which is preferably disposed essentially parallel to the base plate portion. This makes it possible to make the housing parts of different materials, which are selected to be optimized with respect to the heat stress on the electrically operated device, for instance, and otherwise with respect to other criteria. These other criteria may be strength, price, ease of manufacture, and so forth.

The housing part facing the electrically operated device preferably has a recess which can receive a lamp base, a part of it, or a part of the electrically operated device. The first portions of the retaining spring protrude into this recess in order to secure or fix in place the part of the equipment inserted into the recess. The recess is bounded for instance by a wall surrounding a plane face of the housing part. If this wall is missing, as can be the case with sockets for halogen lamps, for instance, then the portions of the retaining spring protrude into the region located in front of the applicable housing wall, in order to grasp the electrically operated device here and hold it.

The socket preferably has two clamping springs, which in turn are preferably located opposite one another and are embodied identically. It thus suffices to produce clamping springs of a single type, making assembly and stockkeeping easier and less expensive.

Preferably, the second housing part, like first the housing part, has fastening portions, and the fastening portions of the two housing parts preferably rest on one another. If they extend through a fastening opening, then a corresponding fastening element, such as a rivet or screw, extends through portions of both housing parts and thus holds them together. This leads to an especially secure closure of the housing in the assembled state. The second portion, preferably embodied as a retaining clamp, of each clamping spring then serves merely as a temporary securing means for shipping of the socket from the manufacturer to the installation site. This makes the demands made in terms of an assurance of the connection less stringent, which in turn can be used to achieve economies in construction and assembly.

The second portion of the clamping spring preferably has two legs, of which one is embodied as a snap-in leg and the other as a spring leg. In one advantageous embodiment, the snap-in leg extends in rectilinear extension of the first portion, which serves the purpose of snap-in fastening of the electrically operated device. The second leg extends approximately at a right angle away from the first leg. In this basic configuration, the assembly of the clamping spring and thus of the retaining clamp can be accomplished by simply inserting them into a suitable snap-in profile embodied on one of the housing parts. The spring leg then clamps the other housing part against the first housing part.

A snap-in lug disposed on the first housing part and disposed for instance in a well of the housing part, can serve as the snap-in profile. The first leg of the retaining clamp should be inserted into this part.

The second leg of the retaining clamp preferably also has a fastening opening, which is aligned with the fastening openings of the fastening portions. Thus a fastening means (such as a screw or rivet), with which the socket is secured to a support, not only serves to fasten onto the support and to fasten the housing parts to one another but at the same also to fasten the clamping spring to the housing.

Turning now to the drawings, FIG. 1 shows a lamp socket 1 according to one embodiment of the invention. The socket according to this example serves as a socket for an electrically operated device. The lamp socket 1 may be used with a discharge lamp, such as a fluorescent lamp. It has a socket housing 2, which comprises a nonmetal material, such as plastic (if necessary, heat-resistant plastic). On its side toward the lamp, the socket housing 2 has a recess 3, which serves to receive a portion of the lamp, or its base. The recess 3 is bounded by a wall 4, which is joined integrally to the socket housing 2. The bottom of the recess 3 is formed by a flat front housing wall 5, in which two connection openings 6, 7 are embodied in the form of indentations, the bottom of which has a connection hole. These holes lead into a housing interior 8, which can be seen for instance in FIGS. 2 or 4. From the inside of the bottom of the indentations 6, 7, extensions 6*a*, 7*a* extend into the interior 8 and define two contact chambers. The housing interior 8 is bounded by two housing parts 9, 11, which form the socket housing 2 and can be seen particularly well in FIG. 2. The front housing part 9, adjoining the front housing wall 5, has a wall 12 which annularly surrounds the housing interior 8. On the side remote from the front housing wall 5, the wall 12 adjoins an end face 13, which is preferably essentially flat. The end face 13 forms a contact face, with which the housing part 9 is seated on a flat front side 14 of the lower housing part 11.

Figure 4:
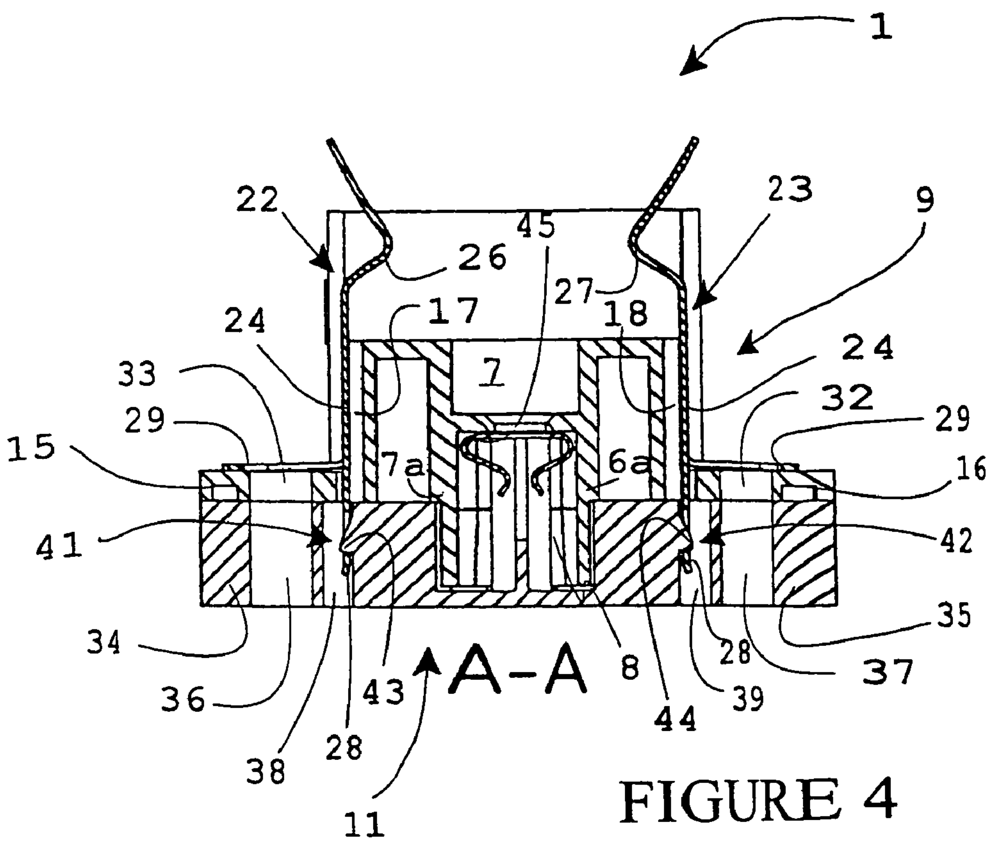
FIG. 4 is a cross-sectional view of the socket of FIG. 3, taken along a line A—A.

Two fastening portions 15, 16, diametrically oppose one another and extend away from the wall 12. The undersides of the fastening portions 15, 16 are disposed in the same plane as the end face 13. When the socket housing 2 is closed, as FIG. 4 shows, their undersides rest on the front side 14 of the housing part 11. The end face 13 of the housing part 9 dips into the housing interior 8 of the lower housing part 11. The housing parts 9, 11 are nested one inside the other to this extent.

In the immediate vicinity of each of the fastening portions 15, 16, the housing part 9 has strip-like indentations 17, 18 which, beginning at the fastening portions 15, 16, extend parallel to one another in the direction of the wall 4, interrupting this wall. Accordingly, the wall 4 has two recesses 19, 21 opposite one another. Clamping springs 22, 23, which serve to fasten gas discharge lamps to the lamp socket 1, are inserted into the indentations 17, 18. The clamping springs 22, 23 are preferably embodied identically to one another and are preferably disposed in mirror symmetry on the lamp socket 1. The following description of the clamping spring 23 applies also to the clamping spring 22.

The clamping spring 23 has a first portion 24 for snap-in fastening of an electrically operated device and also has a second portion 25, which serves to hold the housing parts 9, 11 together. The portion 24 of the clamping spring 23 is bent through the recess 21 of the wall 4 into the recess 3. Beginning at that recess, the portion 24 is in turn bent at an angle outward, so that lugs 26, 27 protruding into the recess 3 are formed. These serve as snap-in means for resiliently retaining a lighting means in the lamp socket 1.

The second portion 25 of the clamping spring 23 forms a retaining clamp for the two housing parts 9, 11. For that purpose, it has two legs 28, 29, which together form an acute, but preferably almost right angle. The angle can preferably amount to approximately 80° or 85°. The first leg 28 extends preferably in rectilinear extension of the portion 24, while the second leg 29 is bent off transversely. The leg 29 has a recess 31, which matches the outline of the leg 28. The leg 29 can therefore be created in the production of the clamping spring 23, by first defining a U-shaped parting line that defines the recess 31 and then bending the leg 29 out of it. The recess 31 is preferably disposed such that it defines a fastening opening 32, which is embodied in the fastening portion 16.

The lower housing part 11, like the upper housing part 9, has fastening portions 34, 35, which are disposed diametrically opposite one another and are located below the fastening portions 15, 16. The fastening portions 34, 35 each have a respective fastening opening 36, 37, which is aligned with the respective fastening opening 32, 33 (FIG. 4). In the immediate vicinity of the fastening openings 36, 37, wells 38, 39 are embodied in the lower housing part 11 and serve to receive the legs 28. The legs 28 are each provided with recesses 41, 42, with which are associated snap-in lugs 43, 44 disposed in the wells 38, 39 and embodied on the housing part 11. The snap-in lugs are preferably disposed on the inner sides, that is, the sides pointing toward one another, of the wells 38, 39. The profile of the snap-in lugs 43, 44 is selected such that easy insertion of the legs 28 is made possible, with these legs spreading apart resiliently and preventing the legs from being pulled out of the wells 38, 39. To that end, the snap-in lugs 43, 44 form an acute angle with the walls of the wells 38, 39. Toward the bottom, they are defined by a face oriented perpendicular to the well wall.

The position of the snap-in lugs 43, 44 is selected such that the legs 29 rest with resilient pre-stressing on the top of the fastening portions 15, 16 when the legs 28 are interlocked with the snap-in lugs 43, 44. As a result, the fastening portions 15, 16, and thus the upper housing part 9, are pressed against the lower housing part 11.

Figure 2:
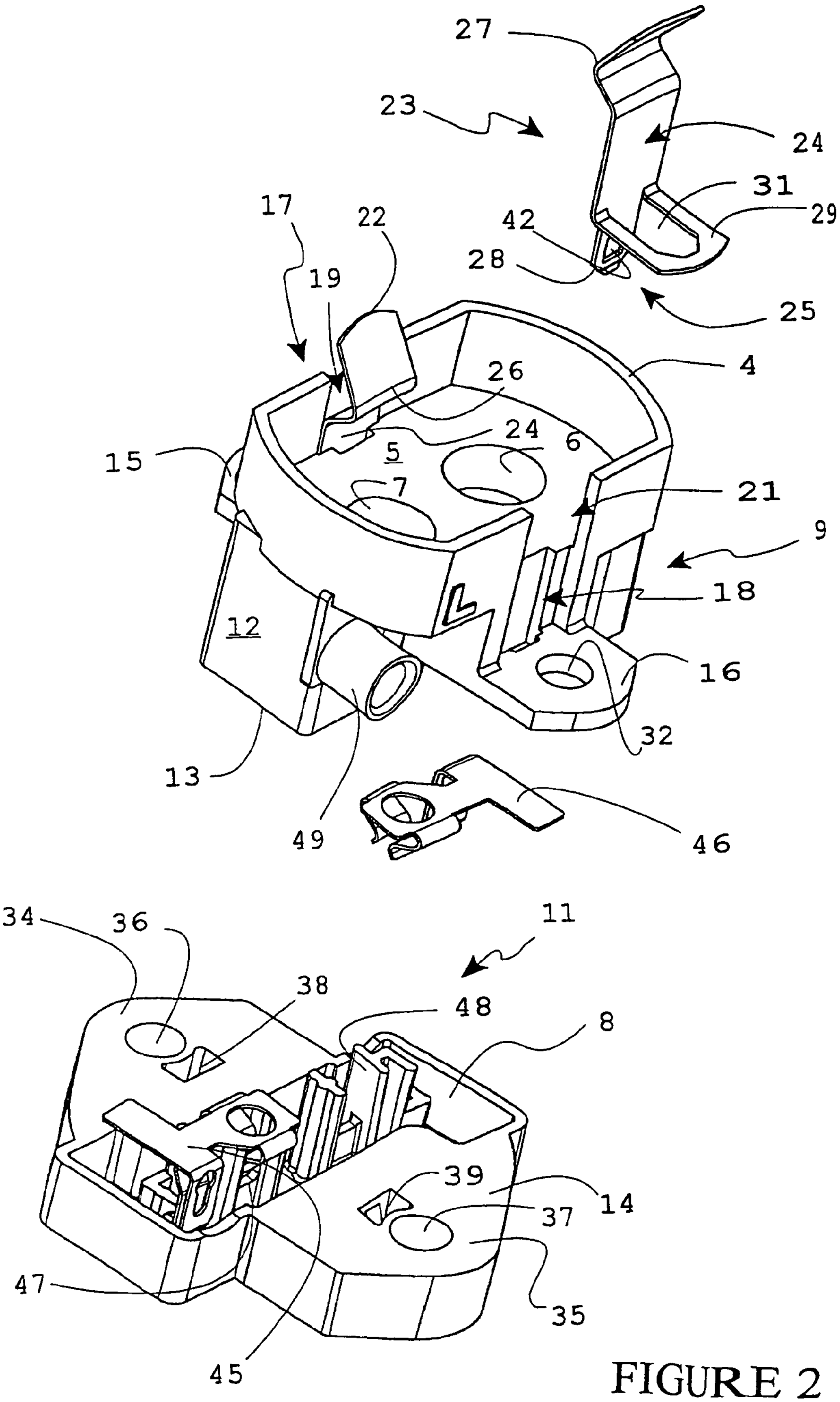
FIG. 2 is an exploded view of the socket of FIG. 1.
Figure 3:
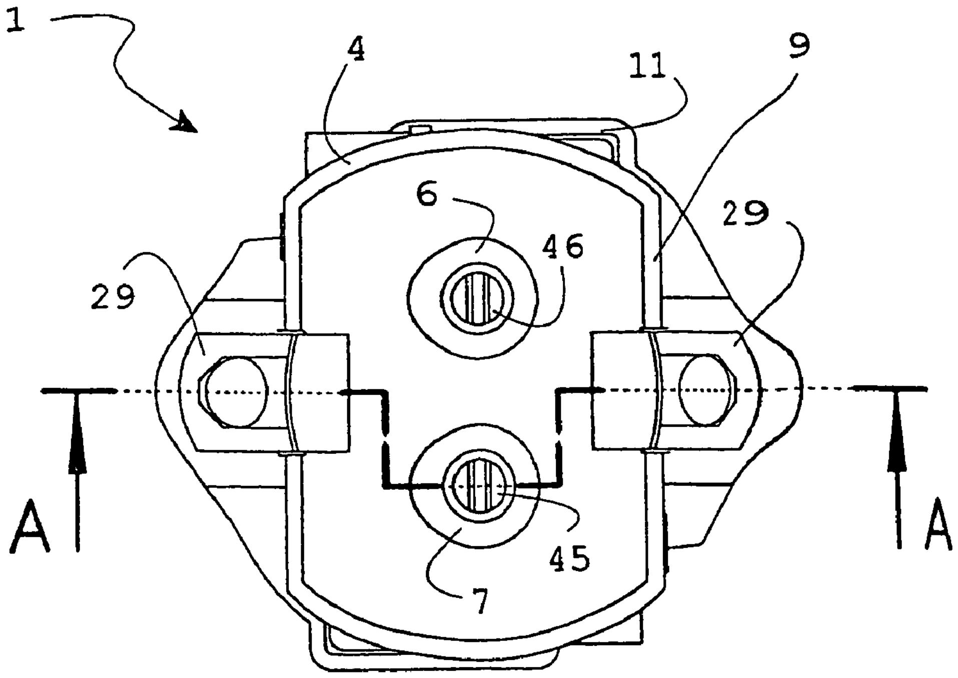
FIG. 3 is a front plan view of the socket of FIG. 1.

In the interior 8 that is thus kept closed, two contact springs 45, 46 are disposed (FIG. 3), which rest on corresponding extensions 47, 48 of the lower housing part 11 that are shown in FIG. 2. The contact springs 45, 46 are preferably embodied identically to one another and are preferably disposed in mirror symmetry to one another. Each contact spring 45, 46 has a connection portion for the contact pin of a discharge lamp as well as a connection for an external electrical conductor. The latter have housing openings assigned to them, from which a tubular extension 49 extends (see FIG. 2). The contact springs 45, 46, which are seated on the extensions 47, 48 and held by them, are disposed directly below the connection openings 6, 7 and are accessible through them. This is illustrated in principle in FIG. 3.

The lamp socket 1 described thus far is assembled and used as follows:

With the legs 28 pointing upward, the clamping springs 22, 23 are placed in a suitably shaped recess. Then the housing part 9, with the wall 4 pointing downward, is slipped onto the clamping springs 22, 23 in such a way that the portions 24 dip into the recesses 19, 21, until the fastening portions 15, 16 come to rest on the undersides of the legs 29. The contact springs 45, 46 are placed with their bottom face in the interiors of the housing part 9. Finally, the housing part 11, with the downward-pointing extensions 47, 48, is placed on the housing part 9 and pressed downward by means of an assembly device until the legs 28 lock onto the snap-in lugs 43, 44.

Alternatively, the following assembly is possible:

First, the contact springs 45, 46 shown in FIG. 2 are placed on the extensions 47, 48, and the housing part 9 is placed on the housing part 11. The extensions 6*a*, 7*a* move over the contacts 45, 46 in the process and firmly clamp them onto the extensions 47, 48.

For joining the two housing parts to one another, the clamping springs 22, 23 are inserted from above into the recesses 19, 21 and displaced toward the housing part 11. In the process, the legs 28 dip into the wells 38, 39, moving over the snap-in lugs 43, 44. They are deflected flexibly outward away from one another by the snap-in lugs 43, 44. The legs 29 then press against the fastening portions 15, 16 and in the process are forced resiliently into the position shown in FIG. 4, in which they protrude virtually at right angles away from the portions 24, 25. Once this state is reached, the legs 28 snap behind the snap-in lugs 43, 44, whereupon the clamping springs 22, 23 are locked to the socket housing 2. At the same time, the housing parts 9, 11 are held together. Thus the legs 28, 29 of the two clamping springs 22, 23 hold the housing parts 9, 11 together like a retaining clamp, so that the lamp socket 1 cannot fall apart either during shipping nor in assembly operations.

For mounting the lamp socket 1 on a support, fastening elements such as rivets or screws are inserted through the fastening openings 33, 36 and 32, 37 and secured in that position. These fastening elements exert a pressure on the legs 29 in the process and moreover press the fastening portions 15, 16 against the fastening portions 34, 35. As a result, the lamp socket 1 is firmly held together.

If during use a lighting means is inserted into the lamp socket 1, its base or one end thereof comes to be located between the lugs 26, 27 of the clamping springs 22, 23. This forces the lugs apart and thus tenses them. The clamping springs 22, 23 are braced with their respective legs 29 on the upper housing part 9 and with their legs 28 on the lower housing part 11. As a result, releasing the clamping springs 22, 23 cannot be done. Conversely, if the clamping springs 22, 23 are urged in the opposite direction, for instance by being pressed against one another, as in the context of improper handling, they can still not be released from the socket housing 2 even if the lamp socket 1 is not mounted on some underlying support, nor a lighting means is seated between the clamping springs 22, 23. On the contrary; the clamping springs rest with their portions 24, 25 on the bottom of the respective indentations 17, 18. Therefore they cannot be bent inward far enough that the legs 28 release the snap-in lugs 43, 44.

A socket according to the invention for an electrically operated device has two housing parts 9, 11, which are held together by clamping springs 22, 23. Each clamping spring has at least one leg 28 with an for example rectangular recess 41, 42, which in the installed state is interlocked with a snap-in lug 43, 44 of one housing part 11. Another leg 29 of each clamping spring 22, 23 extends at an angle <90° to the leg 28 and rests resiliently on the other housing part 9. As a result, production variations that occur can be compensated for, so that both housing parts 9, 11 are held against one another without play. The production and assembly of such lamp sockets 1 are simplified considerably, compared to known lamp sockets.

Although the invention has been described in reference to a particular embodiment, various other embodiments and modifications will be apparent to those skilled in the art. It is therefore intended that the foregoing description of a preferred embodiment be considered as exemplary only.

What is claimed is:

1. A socket for an electrically operated device, comprising:

- a housing, including at least a first housing part and a second housing part, which together enclose an interior, the first housing part having first fastening portions and the second housing part having second fastening portions, which rest on the first fastening portions of the first housing part;
- at least one contact disposed in said interior; and
- at least one clamping spring having a first portion for snap-in fastening of the electrically operated device and a second portion that clamps and retains together the first and second housing parts, wherein the second portion of the clamping spring has a leg, which rests on one of the fastening portions of the second housing part, the leg having a fastening opening, which matches a fastening opening embodied in the housing parts.

2. The socket of claim 1, wherein the at least one clamping spring comprises at least two clamping springs disposed opposite one another.

3. The socket of claim 1, wherein the leg of the clamping spring is resiliently pre-stressed against the fastening portion of the second housing part.

4. The socket of claim 1, wherein said electrically operated device is a lamp.

5. The socket of claim 1, wherein the second housing part, on a side remote from the first housing part, has a recess for receiving at least one portion of the electrically operated device.

6. The socket of claim 5, wherein the first portion of the clamping spring protrudes into the recess.

7. The socket of claim 1, wherein the socket has two clamping springs.

8. The socket of claim 7, wherein the clamping springs are identical to one another.

9. The socket of claim 1, wherein that the first fastening portions of the first housing part comprises a base part with a base plate portion for fastening the base part to a support element.

10. The socket of claim 9, wherein the first fastening portions are diametrically opposite one another and include fastening openings.

11. The socket of claim 9, wherein the two housing parts together define a parting seam, which is disposed essentially parallel to the base plate portion.

12. The socket of claim 1, wherein the second portion of the clamping spring has another leg that snaps together with the first housing part.

13. The socket of claim 12, wherein the two legs of the clamping spring together form an essentially right angle.

14. The socket of claim 12, wherein the leg that snaps together with the first housing part has a snap-in recess, with associated a snap-in lug disposed on the first housing part.

15. The socket of claim 14, wherein the snap-in lug is disposed in the well.

16. The socket of claim 12, wherein the leg that snaps together with the first housing part is disposed in a rectilinear extension of the first portion of the retaining spring.

17. The socket of claim 16, wherein the first housing part has a well, into which extends the leg that snaps together with the first housing part.

18. The socket of claim 17, wherein the snap-in lug is disposed in the well.

* * * * *